US011594659B2

(12) United States Patent
Tångring et al.

(10) Patent No.: US 11,594,659 B2
(45) Date of Patent: Feb. 28, 2023

(54) OPTOELECTRONIC COMPONENT, METHOD FOR DRIVING AN OPTOELECTRONIC COMPONENT, AND ILLUMINATION DEVICE

(71) Applicant: OSRAM Opto Semiconductors GmbH, Regensburg (DE)

(72) Inventors: Ivar Tångring, Regensburg (DE); Stefan Heckelmann, Barbing (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/281,755

(22) PCT Filed: Sep. 24, 2019

(86) PCT No.: PCT/EP2019/075716
§ 371 (c)(1),
(2) Date: Mar. 31, 2021

(87) PCT Pub. No.: WO2020/069920
PCT Pub. Date: Apr. 9, 2020

(65) Prior Publication Data
US 2021/0391498 A1 Dec. 16, 2021

(30) Foreign Application Priority Data
Oct. 4, 2018 (DE) .......................... 102018124473.8

(51) Int. Cl.
*H01L 33/10* (2010.01)
*H05B 45/20* (2020.01)
(Continued)

(52) U.S. Cl.
CPC ............ *H01L 33/105* (2013.01); *A01G 7/045* (2013.01); *H01L 33/22* (2013.01); *H05B 45/20* (2020.01)

(58) Field of Classification Search
CPC ....... H05B 45/20; H01L 33/105; H01L 33/22; A01G 7/045
See application file for complete search history.

(56) References Cited

U.S. PATENT DOCUMENTS

2002/0139984 A1* 10/2002 Sugawara ............... H01L 33/08
257/79
2003/0205714 A1 11/2003 Sugawara et al.
2006/0267026 A1* 11/2006 Kim ..................... H01L 25/0756
372/45.01
(Continued)

FOREIGN PATENT DOCUMENTS

CN 103190003 B * 8/2016 ............. H01L 33/02
DE 102004052245 A1 2/2006
DE 102015105693 A1 10/2016
DE 102018107673 A1 * 9/2019 ............. H01L 33/38
(Continued)

OTHER PUBLICATIONS

International Search Report and Written Opinion in corresponding International Application No. PCT/EP2019/075716 dated Dec. 10, 2019, 13 pages.

*Primary Examiner* — Abdullah A Riyami
*Assistant Examiner* — Syed M Kaiser
(74) *Attorney, Agent, or Firm* — MH2 Technology Law Group LLP

(57) ABSTRACT

An optoelectronic component is specified comprising a semiconductor body comprising a first semiconductor layer sequence and a second semiconductor layer sequence which are arranged on top of one another in a stacking direction, wherein the first semiconductor layer sequence has a first active region, which generates electromagnetic primary radiation with a first peak wavelength the second semicon- (Continued)

ductor layer sequence comprises a second active region, which has a section configured to partially absorb electromagnetic primary radiation and to re-emit electromagnetic secondary radiation having a second peak wavelength, and the first peak wavelength is in a red wavelength range and the second peak wavelength is in an infrared wavelength range, or the first peak wavelength is smaller than the second peak wavelength by at most 100 nanometers.

16 Claims, 4 Drawing Sheets

(51) Int. Cl.
*A01G 7/04* (2006.01)
*H01L 33/22* (2010.01)

(56) References Cited

U.S. PATENT DOCUMENTS

| 2013/0320299 | A1* | 12/2013 | Li | H01L 33/08 |
| | | | | 438/35 |
| 2018/0000016 | A1 | 1/2018 | Amiya et al. | |

FOREIGN PATENT DOCUMENTS

| EP | 2193550 B1 | 6/2010 | | |
| JP | 2019050359 A | * 3/2019 | ........... | H01L 33/405 |
| KR | 20170075966 A | * 7/2017 | ........... | H01L 33/486 |
| WO | 2006062588 A1 | 6/2006 | | |
| WO | 2010108811 A1 | 9/2010 | | |
| WO | 2010149539 A1 | 12/2010 | | |
| WO | WO-2012072519 A1 | * 6/2012 | ....... | H01L 31/02005 |
| WO | 2015181072 A1 | 12/2015 | | |
| WO | 2019141586 A1 | 7/2019 | | |

* cited by examiner

OPTOELECTRONIC COMPONENT, METHOD FOR DRIVING AN OPTOELECTRONIC COMPONENT, AND ILLUMINATION DEVICE

CROSS-REFERENCE TO RELATED APPLICATIONS

This patent application is a national stage entry from International Application No. PCT/EP2019/075716, filed on Sep. 24, 2019, published as International Publication No. WO 2020/069920 A1 on Apr. 9, 2020, and claims priority under 35 U.S.C. § 119 from German patent application 10 2018 124 473.8, filed Oct. 4, 2018, the entire contents of all of which are incorporated by reference herein.

FIELD

An optoelectronic component and a method for driving an optoelectronic component are specified. Furthermore, an illumination device comprising an optoelectronic component is specified.

BACKGROUND

An object to be solved is to specify an optoelectronic component which is particularly space-saving. Furthermore, a method for driving such an optoelectronic component and an illumination device has to be specified.

SUMMARY

According to at least one embodiment, the optoelectronic component comprises a semiconductor body comprising a first semiconductor layer sequence and a second semiconductor layer sequence arranged above one another in a stacking direction. The semiconductor body is, for example, an epitaxially grown semiconductor body. For example, the semiconductor body is based on a III-V compound material.

The first semiconductor layer sequence of the semiconductor body includes, for example, a first semiconductor region of a first conductivity type and a second semiconductor region of a second, different conductivity type. For example, the first semiconductor region is p-doped and thus p-conductive, and the second semiconductor region is, for example, n-doped and thus n-conductive.

In the optoelectronic component described herein, it is particularly possible that the first semiconductor layer sequence and the second semiconductor layer sequence are different compound semiconductor materials, in particular are based on different III-V compound semiconductor materials.

The compound semiconductor material of the first semiconductor layer sequence can preferably be a phosphide compound semiconductor material. Phosphide compound semiconductor materials are compound semiconductor materials containing phosphorus, such as the materials from the system $In_xAl_yGa_{1-x-y}P$ with $0 \leq x \leq 1$, $0 \leq y \leq 1$ and $x+y \leq 1$.

The compound semiconductor material of the second semiconductor layer sequence can preferably be an arsenic compound semiconductor material. Arsenic compound semiconductor materials are compound semiconductor materials containing arsenic, such as the materials from the system $In_xAl_yGa_{1-x-y}As$ with $0 \leq x \leq 1$, $0 \leq y \leq 1$ and $x+y \leq 1$.

The optoelectronic component further comprises a main extension plane. The semiconductor body has a stacking direction transverse or perpendicular to the main extension plane.

The second semiconductor layer sequence is preferably arranged such that the electromagnetic primary radiation from the first semiconductor layer sequence can enter the second semiconductor layer sequence. For this purpose, the second semiconductor layer sequence is arranged, for example, on a radiation passage surface of the first semiconductor layer sequence. In this case, the second semiconductor layer sequence is arranged, for example, in the stacking direction on the second semiconductor region of the first semiconductor layer sequence.

A majority of the electromagnetic primary radiation generated in the first semiconductor layer sequence enters the second semiconductor layer sequence. Preferably, at least 50%, in particular preferably at least 70%, especially preferably at least 85% of the electromagnetic primary radiation enters the second semiconductor layer sequence.

According to at least one embodiment, the first semiconductor layer sequence comprises a first active region, which generates electromagnetic primary radiation with a first peak wavelength. Preferably, the first active region is arranged between the first semiconductor region and the second semiconductor region. In particular, the first active region is directly adjacent to the first semiconductor region and the second semiconductor region. The first active region preferably has a pn junction for generating the electromagnetic primary radiation, such as a double heterostructure, a single quantum well (SQW) structure, or a multiple quantum well (MQW) structure.

The first semiconductor layer sequence with the first active region, which is formed, for example, with a phosphide compound semiconductor material or has a phosphide compound semiconductor material, generates electromagnetic radiation in a green to infrared wavelength range.

For example, the first peak wavelength generated by the first active region is between 640 nm and 780 nm, inclusive.

According to at least one embodiment, the second semiconductor layer sequence comprises a second active region, which has a section configured to partially absorb electromagnetic primary radiation and re-emit electromagnetic secondary radiation having a second peak wavelength. Further, the second active region can also have, for example, a plurality of sections. For example, the sections are arranged on top of one another along the stacking direction. For example, the second active region can have a single quantum well (SQW) structure or a multiple quantum well (MQW) structure. For example, if the second active region has a single section, the second active region is a single quantum well structure. For example, if the second active region has the plurality of sections, the second active region is a multiple quantum well structure having a plurality of single quantum well structures.

Preferably, the second peak wavelength of the electromagnetic secondary radiation is formed larger than the first peak wavelength of the electromagnetic primary radiation.

Preferably, the second active region is arranged between two compound materials. The compound material, which is arranged between the second active region and the first semiconductor layer sequence, connects the first semiconductor layer sequence and the second semiconductor layer sequence mechanically rigid to one another.

For example, the compound materials have $Al_xGa_{1-x}As$ with $0 \leq x \leq 1$ or are formed therefrom. Advantageously, the first semiconductor layer sequence and the second semiconductor layer sequence can thus be fabricated in a single epitaxial growth process. In this case, the first semiconductor layer sequence and the second semiconductor layer sequence are advantageously monolithically connected to one another.

According to at least one embodiment, the first peak wavelength is in a red wavelength range and the second peak wavelength is in an infrared wavelength range. Preferably, the first peak wavelength is between 640 nm and 700 nm, inclusive. Further preferably, the second peak wavelength is between 700 nm and 1000 nm, inclusive.

According to at least one embodiment, the first peak wavelength is smaller than the second peak wavelength by at most 100 nm. Preferably, the first peak wavelength has a wavelength of 660 nm and the second peak wavelength has a wavelength of 730 nm.

In at least one embodiment, the optoelectronic component comprises
- a semiconductor body, which comprises a first semiconductor layer sequence and a second semiconductor layer sequence, which are arranged above one another in a stacking direction, wherein
- the first semiconductor layer sequence has a first active region, which generates electromagnetic primary radiation having a first peak wavelength
- the second semiconductor layer sequence comprises a second active region, which has a section configured to partially absorb electromagnetic primary radiation and re-emit electromagnetic secondary radiation having a second peak wavelength, and
- the first peak wavelength is in a red wavelength range and the second peak wavelength is in an infrared wavelength range, or
- the first peak wavelength is at most 100 nanometers smaller than the second peak wavelength.

One idea of the optoelectronic component described herein is, inter alia, that a semiconductor chip comprises a semiconductor body having a first and a second semiconductor layer sequences. Advantageously, the first and second semiconductor layer sequences can each emit radiation having a different wavelength range. Thus, the optoelectronic component has only a single semiconductor body to generate electromagnetic radiation from two different wavelength ranges. Advantageously, such an optoelectronic component can have a comparatively compact design.

According to at least one embodiment, the first active region is exclusively electrically energized with current and the second active region is exclusively optically pumped. That is to say that electromagnetic secondary radiation in the second active region is not generated by electrically driving the second active region. In particular, the optoelectronic component is free of electrical contacts provided for energizing the second active region.

The optical pumping of the second active region preferably enables a uniform charge distribution in the second active region. Furthermore, the second semiconductor layer sequence can be cooled particularly well advantageously, since the first semiconductor layer sequence acts as a heat sink for the second semiconductor layer sequence. Since only the first semiconductor layer sequence is energized with current, a comparatively low voltage can be applied to operate the optoelectronic component. Furthermore, the first semiconductor layer sequence is preferably formed with a phosphide compound semiconductor material and the second semiconductor layer sequence is formed with an arsenic compound semiconductor material. Advantageously, since current is applied only to the phosphide compound semiconductor material, no current flows across an interface of the two semiconductor layer sequences.

Further, no current is applied to the second active region, thereby not inducing leakage currents and band bending. As a result, a comparatively large dipole moment is realized in the optically pumped second active region, wherein a comparatively high recombination of electrons and holes is achievable. Advantageously, a maximum quantum yield can thus be achieved and the component can be operated particularly efficiently.

According to at least one embodiment, a radiation exit surface of the semiconductor body is roughened. The radiation exit surface of the semiconductor body comprises a top surface of the second semiconductor layer sequence facing away from the first semiconductor layer sequence. The roughening can advantageously increase a light extraction from the optoelectronic component.

According to at least one embodiment, the section of the second active region comprises two sub-regions. Here, the first sub-region has a first bandgap and the second sub-region has a second bandgap that is smaller than the first bandgap. The first sub-region preferably forms an absorption region in which, for example, electromagnetic primary radiation is absorbed. The second sub-region preferably forms an emission region from which electromagnetic secondary radiation is emitted.

Furthermore, the first active region can have a further second bandgap. That is to say that the further second bandgap preferably defines electrical properties of the active region from which the electromagnetic primary radiation is emitted. For example, the further second bandgap is at most 100 meV larger than the first bandgap of the first sub-region of the second active region.

Further, the compound material of the second semiconductor layer sequence can have a third bandgap, which is larger than the first bandgap. Preferably, the third bandgap is selected to be large enough that no or hardly any electromagnetic primary radiation is absorbed by the third bandgap.

According to at least one embodiment, a maximum absorption wavelength is predetermined by means of the first bandgap. For example, a size of the first bandgap can be predetermined by a choice of the material of the first sub-region. For example, if the material of the first sub-region is selected such that a comparatively large first bandgap results, then electromagnetic primary radiation with a comparatively small primary wavelength can preferably be absorbed. If, on the other hand, the material of the first sub-region is selected such that a comparatively small first bandgap results, electromagnetic primary radiation having a comparatively large primary wavelength can preferably be absorbed particularly well. Also electromagnetic primary radiation having a comparatively small primary wavelength can be absorbed particularly well in this case.

According to at least one embodiment, an absorption strength is predetermined by means of a thickness of the first sub-region. The thickness of the first sub-region is formed by the maximum extension in the stacking direction. The thicker the first sub-region is formed, the higher the absorption strength of the first sub-region for electromagnetic primary radiation.

By means of the second bandgap, a further maximum absorption wavelength is predetermined. Furthermore, the second sub-region also has a thickness, which is preferably smaller than the thickness of the first sub-region. For example, the first sub-region has a thickness of 100 nm. In this case, the second sub-region has the thickness of at least 5 nm and at most 10 nm.

According to at least one embodiment, the second peak wavelength of the secondary radiation is predetermined by means of the second bandgap. A size of the second bandgap is predetermined, for example, by a choice of the material of the second sub-region. For example, if the second bandgap is comparatively large, the secondary radiation emitted by the second sub-region has a comparatively small second peak wavelength.

According to at least one embodiment, the maximum absorption wavelength is at most 50 nm larger than the first peak wavelength of the primary radiation. For example, the maximum absorption wavelength is at most 30 nm larger than the first peak wavelength of the primary radiation.

According to at least one embodiment, the first bandgap has a gradient. For example, the material composition of the first sub-region can vary along the stacking direction. Thus, a gradient of the first bandgap can be predetermined along the stacking direction. Advantageously, such a gradient of the first bandgap can increase the probability that electron hole pairs diffuse into the second sub-region.

According to at least one embodiment, the first bandgap decreases towards the second bandgap. That is to say that the first bandgap from the first sub-region facing away from the second sub-region preferably has a comparatively large first bandgap that decreases in the stacking direction. By means of such a first bandgap, a stepwise confinement of excited electrons in a conduction band is possible. Advantageously, such a stepwise confinement can increase the probability that electron hole pairs diffuse into the second sub-region.

In another embodiment, for example, the second active region can have a plurality of sections each comprising two sub-regions. The two sub-regions preferably have different material compositions for each section of the plurality of sections. That is to say that an absorption wavelength, an absorption strength, and/or a second peak wavelength can be individually predetermined for each section of the plurality of sections by means of the respective two sub-regions.

Accordingly, it is possible for the second active region having the plurality of sections to absorb electromagnetic primary radiation having the first peak wavelength and re-emit a plurality of secondary radiations having a plurality of second peak wavelengths. In this case, the second peak wavelengths can preferably be different.

Further, the primary radiation and the plurality of secondary radiations can intermix to form an envelope emission spectrum. The envelope emission spectrum is formed by, for example, an emission spectrum of the primary radiation and an emission spectrum of each of the plurality of secondary radiations and, preferably, can approximately have the form of a rectangular function. The primary radiation and the plurality of secondary radiations each have a spectral intensity or a spectral luminous flux, which can be graphically represented in the respective emission spectrum as a function of the wavelength $\lambda$. The respective emission spectra can each be represented by a curve, in which the wavelength is plotted on the x-axis and the spectral intensity or the spectral luminous flux is plotted on the y-axis.

Furthermore, the respective emission spectra for the primary radiation and the plurality of secondary radiations can have a maximum and a halve width half maximum. Here, the term halve width half maximum refers to the curve of a respective emission spectrum, where the halve width is the area on the x-axis corresponding to the two y-values corresponding to half of the respective maximum.

Preferably, the distances between the maxima and the respective corresponding halve width half maxima are such that the spectral intensity between two maxima is in each case at most 5% smaller than the maximum spectral intensity. The emission spectrum of the primary radiation and the emission spectra of the plurality of secondary radiations preferably overlap to form the envelope emission spectrum, which approximately has the form of a rectangular function.

Such an optoelectronic component can advantageously be used to implement a broadband emitter whose first peak wavelength is in a red wavelength range and whose second peak wavelengths are partially in an infrared wavelength range. Such a broadband emitter can be used, for example, in spectroscopic applications.

According to at least one embodiment, the primary radiation has a spectral intensity that is greater than a spectral intensity of the secondary radiation. The spectral intensity of the secondary radiation is preferably 20% of the spectral intensity of the primary radiation. Such a comparatively low spectral intensity of the secondary radiation can be predetermined, for example, by the absorption strength and the absorption wavelength of the second active region.

By means of the different spectral intensities of the primary radiation and the secondary radiation, such an optoelectronic component can be used to illuminate plants and advantageously increase a plant growth by the so-called "Emerson Effect". In this case, the primary radiation has, for example, the first peak wavelength of 660 nm and the secondary radiation has, for example, the second peak wavelength of 730 nm.

According to at least one embodiment, the primary radiation and the secondary radiation intermix to form a mixed radiation. That is to say that during operation, the optoelectronic component emits the mixed radiation.

According to at least one embodiment, the first semiconductor layer sequence comprises a first semiconductor region and a second semiconductor region. Further, the first active region is arranged between the first semiconductor region and the second semiconductor region.

According to at least one embodiment, the first semiconductor region is electrically conductively connected to a first contact structure and the second semiconductor region is electrically conductively connected to a second contact structure. Preferably, the first contact structure is arranged on a main surface of the first semiconductor region facing away from the first active region. Preferably, the first contact structure comprises a metal or is formed from a metal.

Further, the first contact structure can comprise a first layer and a second layer. Preferably, the first layer is configured to be in direct electrically conductive contact with the first semiconductor region in regions. Preferably, the second layer is configured to be reflective to the primary radiation and the secondary radiation. For example, the second layer is a dielectric mirror, a Bragg mirror, a metallic mirror, or a combination of said mirrors. Preferably, the second layer has a reflectivity for the primary radiation and the secondary radiation of at least 90%. Advantageously, a particularly large proportion of the electromagnetic primary and secondary radiation can thus be emitted from the radiation exit surface of the semiconductor body.

Alternatively, it is possible for the second layer to have different reflective properties for the primary radiation and the secondary radiation. For example, the second layer can have a higher reflectivity for the secondary radiation than for the primary radiation.

The second layer is preferably arranged between the first semiconductor region and the first layer, and preferably has a plurality of recesses. The first layer, which is arranged on the second layer, can also preferably be arranged within the recesses of the second layer and be in direct contact with the first semiconductor region in the regions of the plurality of recesses.

Furthermore, the second contact structure is preferably arranged on a main surface of the second semiconductor region facing away from the first active region. The main surface of the second semiconductor region forms the above-mentioned radiation transmission surface of the first semiconductor layer sequence. In this case, the second semiconductor layer sequence is removed in regions in the region of the second contact structure up to the first semiconductor layer sequence. In this way, an opening to the first semiconductor layer sequence is formed. The second contact structure is freely accessible in the region of the opening and can be contacted in an electrically conductive manner.

Alternatively, it is possible that the first semiconductor layer sequence has a recess that completely penetrates the first semiconductor region and the first active region. Furthermore, the recess of the first semiconductor layer sequence partially penetrates the second semiconductor region along the stacking direction. Preferably, the second contact structure is arranged in the recess of the first semiconductor layer sequence such that the second contact structure contacts the second semiconductor region in an electrically conductive manner. Preferably, the first active region and the second contact structure are electrically insulated from one another in the recess, and the first semiconductor region and the second contact structure are electrically insulated from one another in the recess.

Furthermore, a method for driving an optoelectronic component is specified, in particular for driving an optoelectronic component described herein. All features and embodiments disclosed in connection with the optoelectronic component are therefore also disclosed in connection with the method, and vice versa.

According to at least one embodiment of the method, the first active region is energized with at least one first current pulse or with at least one second current pulse. For example, it is possible that the first current pulse or the second current pulse is repeated multiple times.

According to at least one embodiment, the first current pulse is applied to the first active region with a first intensity and over a first time interval. By applying the first current pulse to the first active region with the, for example, comparatively high first intensity and the, for example, comparatively short first time interval, emitted electromagnetic primary radiation is particularly well absorbed by the second active region. In this case, the re-emitted electromagnetic secondary radiation has a particularly high intensity compared to the primary radiation.

According to at least one embodiment, the second current pulse is applied to the first active region with a second intensity and over a first time interval, wherein the first intensity is greater than the second intensity and the first time interval is shorter than the second time interval. In this case, the emitted electromagnetic primary radiation is less well absorbed by the second active region. The re-emitted electromagnetic secondary radiation in this case has a comparatively low intensity compared to the primary radiation.

A difference in the intensity ratio from the primary wavelength to the secondary wavelength when the first current pulse is applied compared to when the second current pulse is applied is, for example, comparatively large when the maximum absorption wavelength belonging to the first bandgap of the first sub-region of the second active region is equal to or only slightly larger than the first peak wavelength of the primary radiation. Slightly larger here means that the difference between the maximum absorption wavelength and the first peak wavelength is preferably at most 50 nm, in particular at most 30 nm. In this case, the intensity ratio from the primary wavelength to the secondary wavelength is adjustable in a comparatively large range via the current pulse used for driving.

The first intensity or the second intensity applied to the first active region can preferably be measured in amperes.

According to at least one embodiment, the first peak wavelength of primary radiation generated by the first current pulse differs from the first peak wavelength of primary radiation generated by the second current pulse by up to 1 nm. That is to say that when the first current pulse is applied to the first active region, the generated first peak wavelength of the primary radiation is preferably smaller by up to 1 nm than when a second current pulse is applied to the first active region.

By means of the method for driving described herein, the intensity of the secondary radiation can advantageously be predetermined by changing the applied current pulse. Further, the driving of the first active region described herein may be combined with the predetermined material composition of the section or plurality of sections of the second active region described above.

Further, an illumination device including an optoelectronic component is specified. In particular, the optoelectronic component is the optoelectronic component described herein. That is, all features and embodiments disclosed in connection with the optoelectronic component described herein are also disclosed in connection with the illumination device described herein, and vice versa.

According to at least one embodiment, the illumination device is configured for illuminating plants. By means of the optoelectronic component described herein, for example, plant growth can be efficiently promoted. For example, red radiation as well as infrared radiation, whose peak wavelength is formed larger than a peak wavelength of the red radiation, can efficiently promote and increase the plant growth and the photosynthesis rate, respectively. The infrared radiation preferably has 20% of the intensity of the red radiation for a particularly high photosynthesis rate. The acceleration of plant growth and the increase of the photosynthesis rate, respectively, by the simultaneous exposure to red radiation and the infrared radiation, is referred to as the Emerson effect. For example, the red radiation is formed by the primary radiation described above and the infrared radiation is formed by the secondary radiation described above.

By means of the optoelectronic component described herein, such an illumination device can advantageously be realized with only one optoelectronic component that produces the red radiation and the infrared radiation simultaneously.

BRIEF DESCRIPTION OF THE DRAWINGS

In the following, the radiation-emitting component described herein is explained in more detail with reference to exemplary embodiments and the associated figures.

They show.

DETAILED DESCRIPTION

Identical, similar of the similar acting elements are provided with the same reference signs in the Figures. The Figures and the proportions of the elements shown in the Figures are not to be regarded as to scale. Rather, individual elements can be shown exaggeratedly large for better representability and/or for better comprehensibility.

Figure 1:
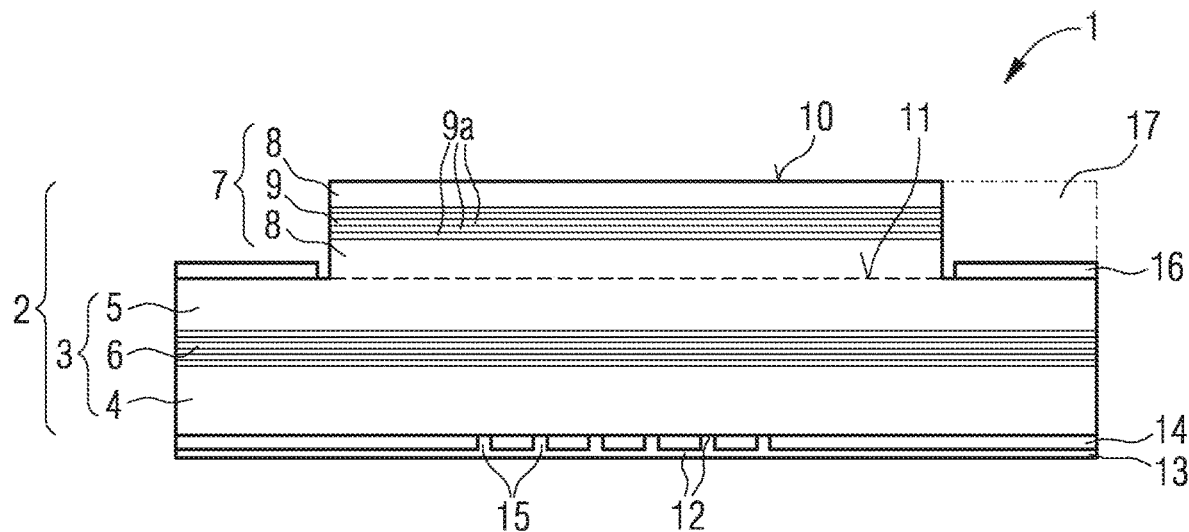
FIG. 1 schematic sectional view of an optoelectronic component according to an exemplary embodiment, FIGS. 2 and 3 schematic sectional view of an optoelectronic component according to an exemplary embodiment, FIG. 4 schematic bandgap diagram according to an exemplary embodiment, FIGS. 5 and 6 schematic emission spectrum according to one embodiment each, and FIGS. 7 and 8 schematic representations of a method for driving an optoelectronic component according to one exemplary embodiment in each.

With FIG. 1, a schematic sectional view of an optoelectronic component 1 according to an exemplary embodiment is shown.

The optoelectronic component according to the exemplary embodiment shown in FIG. 1 comprises a semiconductor body 2, which comprises a first semiconductor layer sequence 3 and a second semiconductor layer sequence 7, which are arranged above one another in a stacking direction.

The first semiconductor layer sequence 3 comprises a first semiconductor region 4 of a first conductivity type and a second semiconductor region 5 of a second, different conductivity type. The first semiconductor layer sequence 3 has a first active region 6, which generates electromagnetic primary radiation 26 having a first peak wavelength. The first active region 6 is arranged between the first semiconductor region 4 and the second semiconductor region 5. The first active region 6 is formed of a multiple quantum well (MQW) structure.

The second semiconductor layer sequence 7 is arranged on the second semiconductor region 5 of the first semiconductor layer sequence 3. The electromagnetic primary radiation 26 from the first semiconductor layer sequence 3 can thus enter the second semiconductor layer sequence 7 particularly well. The second semiconductor layer sequence 7 is arranged on a radiation passage surface 11 of the first semiconductor layer sequence 3.

The second semiconductor layer sequence 7 has a second active region 9. Here, the second active region 9 has a section 9a configured to partially absorb electromagnetic primary radiation 26 and re-emit it into electromagnetic secondary radiation 27 having a second peak wavelength.

In this embodiment, the second active region 9 has a plurality of sections 9a. Thus, the second active region 9 is a multiple quantum well structure having a plurality of single quantum well structures.

The second active region 9 is arranged between two compound materials 8. The compound material 8, which is arranged between the second active region 9 and the first semiconductor layer sequence 3, rigidly connects the first semiconductor layer sequence 3 and the second semiconductor layer sequence 7 mechanically.

The first active region 6 is exclusively electrically driven and the second active region 9 is exclusively optically pumped. That is, electromagnetic secondary radiation 27 is not generated by electrically driving the second active region 9.

The first semiconductor layer sequence 3 is energizable with current by means of a first contact structure 12 and a second contact structure 16. The first semiconductor region 4 is electrically conductively connected to the first contact structure 12 and the second semiconductor region 5 is electrically conductively connected to the second contact structure 16. The first contact structure 12 comprises a first layer 13 and a second layer 14. The first layer and the second layer are arranged on a main surface of the first semiconductor region 3 facing away from the first active region 6. The second layer 14 is formed reflective for the primary radiation 26 and the secondary radiation 27 and is arranged between the first semiconductor region 4 and the first layer 13, and preferably has a plurality of recesses 15. The first layer 13, which is arranged on the second layer 14, is arranged within the recesses 15 of the second layer 14 and is in direct contact with the first semiconductor region 4 in the regions of the plurality of recesses 15.

In this exemplary embodiment, the second contact structure 16 is arranged on a main surface of the second semiconductor region 5 facing away from the first active region 6. The main surface of the second semiconductor region 5 forms the radiation passage surface 11 of the first semiconductor layer sequence 3. The second semiconductor layer sequence 7 is removed in regions in the region of the second contact structure 16 down to the first semiconductor layer sequence 3. In this way, an opening 17 to the first semiconductor layer sequence 3 is formed. The second contact structure 16 is freely accessible in the area of the opening 17 and can be contacted in an electrically conductive manner.

Figure 2:
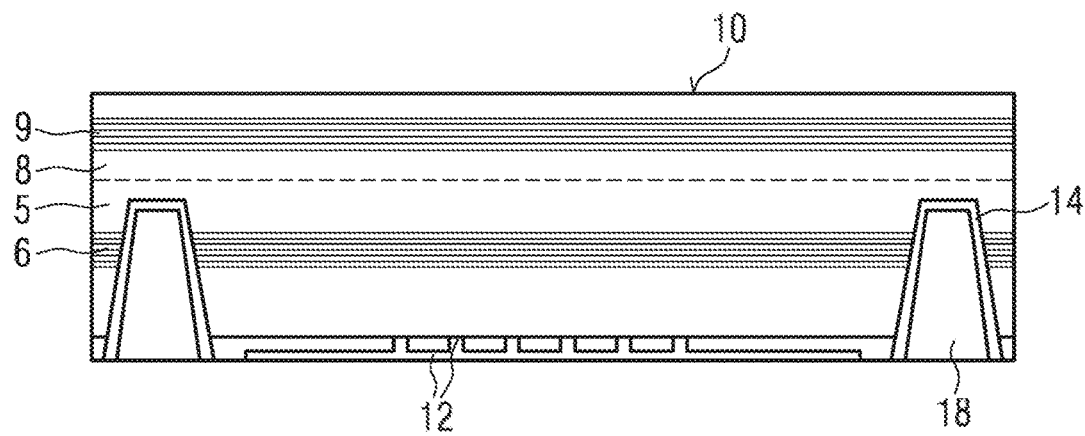

According to FIG. 2, a schematic representation of an optoelectronic component according to a further exemplary embodiment is shown.

In contrast to the exemplary embodiment of FIG. 1, according to FIG. 2 an optoelectronic component 1 is shown in which the first semiconductor layer sequence 3 has a recess 18 which completely penetrates the first semiconductor region 4 and the first active region 6. Furthermore, the recess 18 of the first semiconductor layer sequence 3 partially penetrates the second semiconductor region 5 in the stacking direction. The second contact structure 16 is arranged in the recess 18 of the first semiconductor layer sequence 3 such that the second contact structure 16 is in electrically conductive contact with the second semiconductor region 5. Preferably, the first active region 6 and the second contact structure 16 in the recess 18 and the first semiconductor region 4 are separated from one another in an electrically insulating manner.

Figure 3:
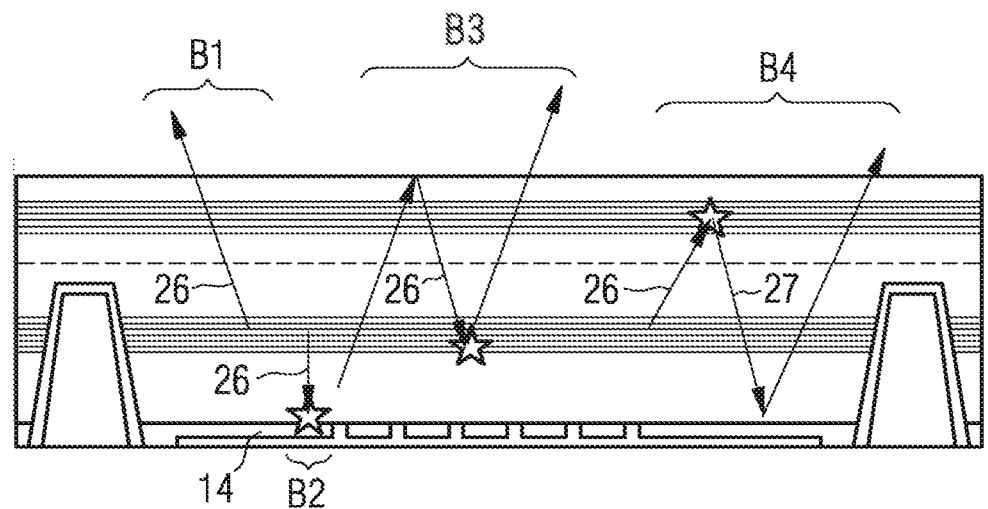

FIG. 3 shows four different ways in which primary radiation 26 or secondary radiation 27 is emitted during operation out of the optoelectronic component. However, the four possibilities do not represent all possibilities. Primary radiation 26 can be emitted out of the optoelectronic component 1 in a first possibility as shown in region B1, without being reflected by the radiation exit surface 10 or being absorbed by the second active region 9.

In region B2, primary radiation 26 and secondary radiation 27 (not shown here) can be absorbed according to a second possibility at the second layer 14 by specular reflection losses. For example, the second layer 14 can be more reflective of secondary radiation 27 than of primary radiation 26.

Primary radiation 26 emitted from the first active region 6 is first reflected in the region B3 at the radiation exit surface 10 toward the first contact structure 12 and absorbed by the first active region 6. Such absorption reduces the quantum efficiency of the first active region 6.

In a region B4, the primary radiation 26 emitted from the first active region 6 is absorbed in the second active region 9 and converted into electromagnetic secondary radiation 27. Since the wavelength of the secondary radiation 27 is configured to be larger than the wavelength of the primary radiation 26, it is preferably not absorbed by the first active region. The secondary radiation 27 is subsequently reflected at the second layer 14 in the direction of the radiation exit surface 10. By suitable selection of the material composition of the second active region 9, the reabsorption of the secondary radiation 27 from the second active region 9 can also be low and subsequently emitted through the radiation exit surface 10.

Figure 4:
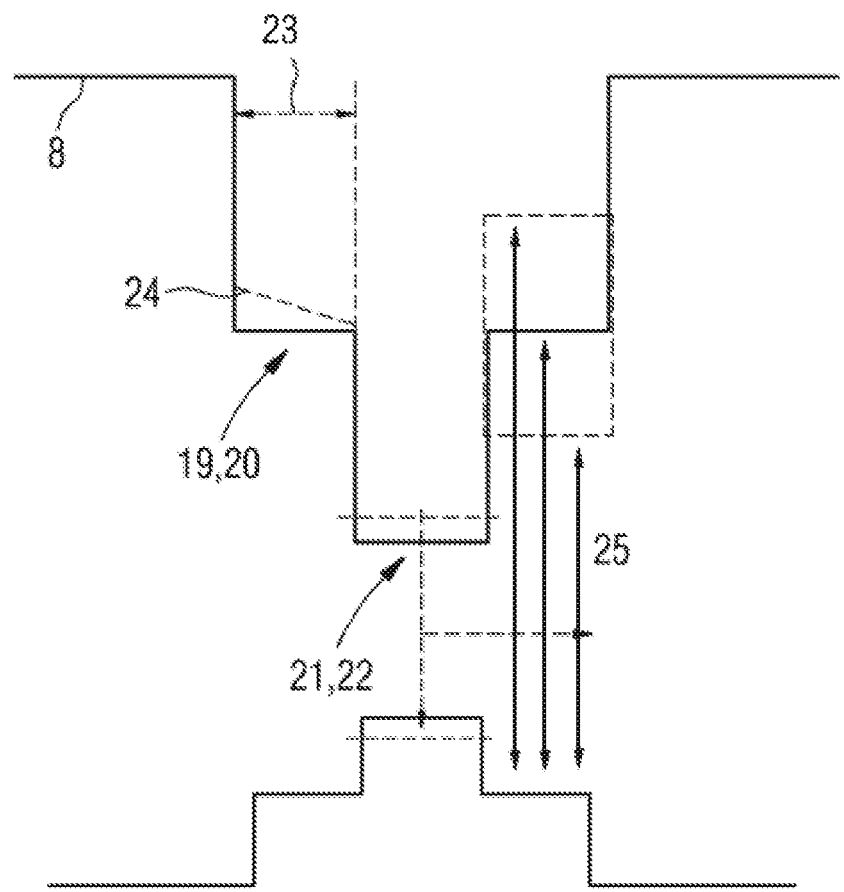

According to FIG. 4, a schematic bandgap diagram of a first bandgap 20 and a second bandgap 22 is shown according to an exemplary embodiment. The second active region 9, in this exemplary embodiment comprises a section comprising two sub-regions 19, 21. The first sub-region 19 has a first bandgap 20 and the second sub-region 21 has a second bandgap 22 that is smaller than the first bandgap 20. The first sub-region 19 preferably forms an absorption region for electromagnetic primary radiation 26. The second sub-region 21 preferably forms an emission region that emits electromagnetic secondary radiation 27, which is shown by dashed arrows in FIG. 4.

By means of the first bandgap, respectively by means of the size of the first bandgap 25, a maximum absorption wavelength is predetermined. Furthermore, the first bandgap 20 has a gradient, so that the first bandgap 20 decreases towards the second bandgap 22. Furthermore, the first sub-region 19 has a thickness 23 with which an absorption intensity of the primary radiation 26 is predetermined.

Figure 5:
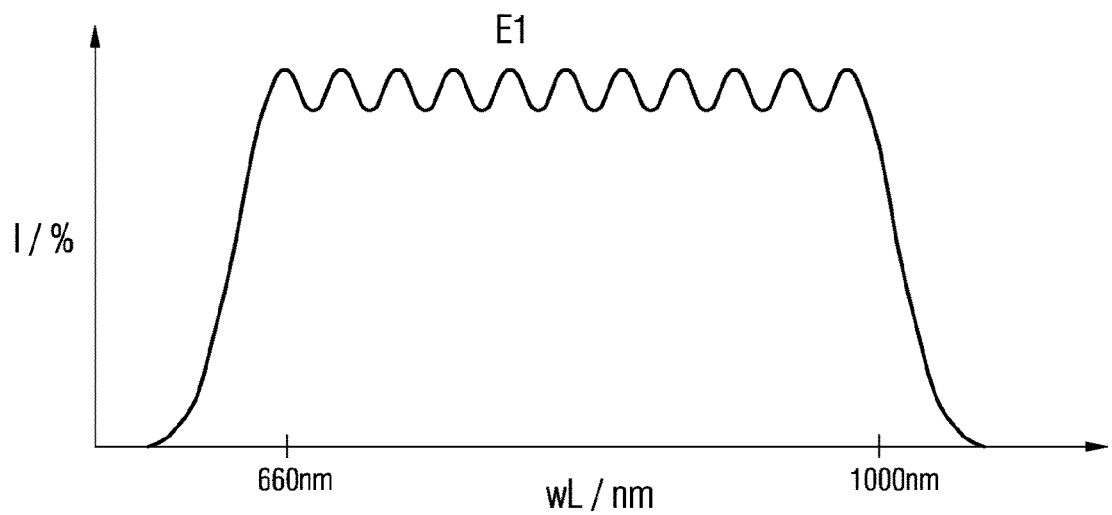

According to FIG. 5, a radiation intensity I in % is plotted over a wavelength wL in nanometers. The curve shows an emission spectrum E1. In this case, the second active region 9 has ten sections 9a, each comprising two sub-regions. The two sub-regions have different material compositions for each section. That is, an absorption wavelength, an absorption intensity, and/or a second peak wavelength can be individually predetermined for each of the ten sections by means of the respective two sub-regions.

Accordingly, the second active region 9 with the ten sections absorbs electromagnetic primary radiation 26 with the first peak wavelength and re-emits ten second peak wavelengths, the ten second peak wavelengths in this case are formed differently.

The primary radiation 26 and the ten secondary radiations intermix and form the emission spectrum E1, which approximately has the form of a rectangular function. With such an optoelectronic component, a broadband emitter can preferably be realized whose first peak wavelength is in a red wavelength range and whose second peak wavelengths are in an infrared wavelength range.

Figure 6:
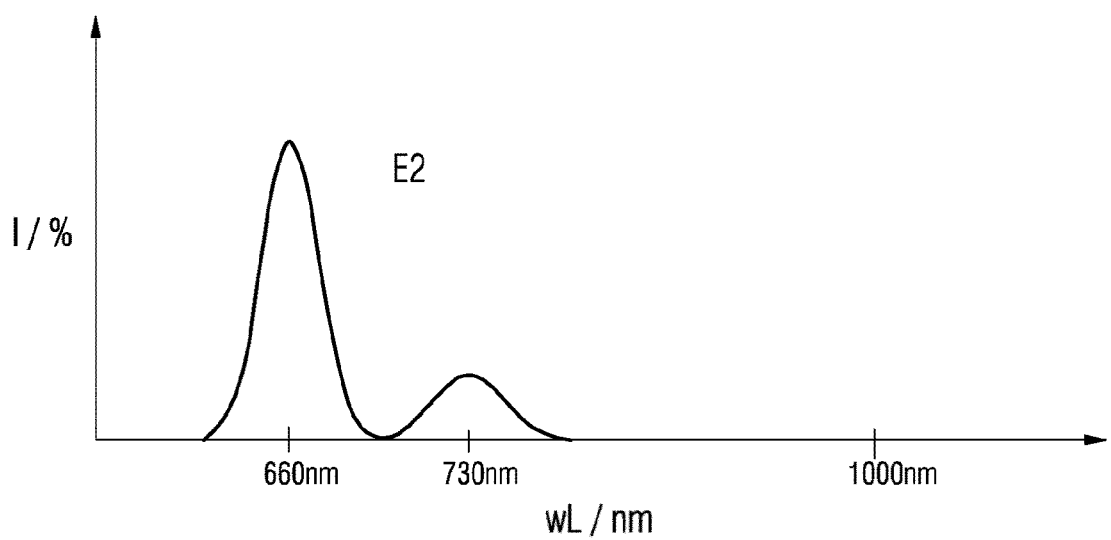

In contrast to the exemplary embodiment of FIG. 5, FIG. 6 shows a further emission spectrum E2. In this case, the second active region 9 has a single section 9a. The resulting emission spectrum E2 has two peaks corresponding to the first peak wavelength of the primary radiation 26 and the second peak wavelength of the secondary radiation 27. Furthermore, the maximum absorption wavelength and the absorption strength of the primary radiation 26 are predetermined by a suitable choice of the material composition of the second active region 9.

Figure 7:
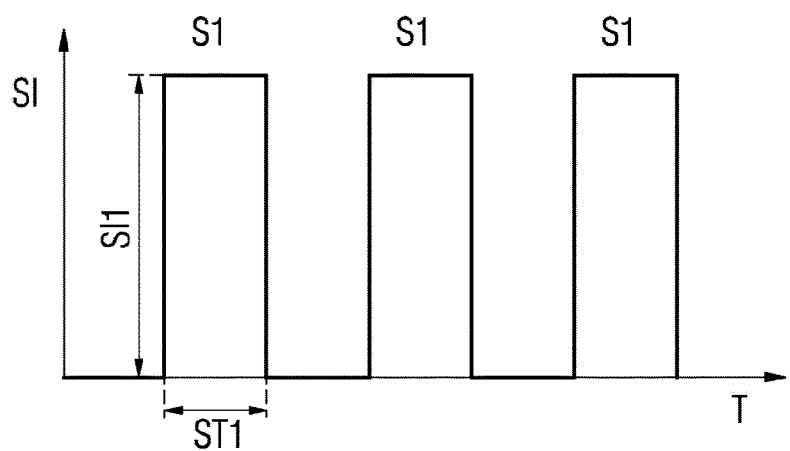
Figure 8:
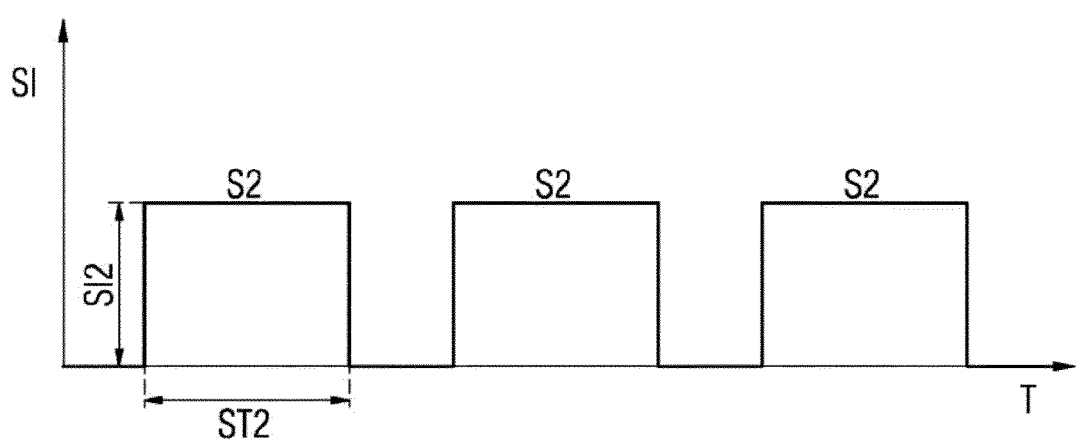

According to FIGS. 7 and 8, schematic representations of a method for driving an optoelectronic component are shown according to one exemplary embodiment each.

According to FIGS. 7 and 8, the first current pulse S1 and the second current pulse S2 are each shown in a current intensity SI-time T diagram.

A first current pulse S1 is first applied to the first active region 6 as shown in FIG. 7. The first current pulse S1 has a comparatively high first intensity SI1 and is applied to the first active region 6 over a comparatively long time interval ST1. The first current pulse S1 is further applied to the first active region 6 multiple times at time intervals.

In contrast to the exemplary embodiment in connection with FIG. 7, a second current pulse S2 is shown according to FIG. 8, which has a comparatively low second intensity SI2 and is applied to the first active region 6 over a comparatively short time interval ST2.

Here, the first peak wavelength of the primary radiation generated by the first current pulse S1 differs from the first peak wavelength of the primary radiation generated by the second current pulse S2 by up to 1 nm.

The invention is not limited to the exemplary embodiments by the description based thereon. Rather, the invention encompasses any new feature as well as any combination of features, which in particular includes any combination of features in the patent claims, even if this feature or combination itself is not explicitly stated in the patent claims or exemplary embodiments.

The invention claimed is:

1. An optoelectronic component comprising
a semiconductor body comprising a first semiconductor layer sequence and a second semiconductor layer sequence, which are arranged above one another in a stacking direction, wherein
the first semiconductor layer sequence has a first active region, which generates electromagnetic primary radiation with a first peak wavelength,
the second semiconductor layer sequence has a second active region, which has a section configured to partially absorb electromagnetic primary radiation and to re-emit electromagnetic secondary radiation having a second peak wavelength,
the first peak wavelength is in a red wavelength range and the second peak wavelength is in an infrared wavelength range,
a radiation exit surface of the semiconductor body comprises a top surface of the second semiconductor layer sequence facing away from the first semiconductor layer sequence, and
the electromagnetic primary radiation and the electromagnetic secondary radiation are emitted from the radiation exit surface.

2. The optoelectronic component according to claim 1, in which
the first active region is exclusively electrically energized with current, and the second active region is exclusively optically pumped.

3. The optoelectronic component according to claim 1, in which a radiation exit surface of the semiconductor body is roughened.

4. The optoelectronic component according to claim 1, in which
the section of the second active region comprises two sub-regions,
a first sub-region has a first bandgap, and
a second sub-region has a second bandgap, which is smaller than the first bandgap.

5. The optoelectronic component according to claim 4, in which
a maximum absorption wavelength is predetermined by means of the first bandgap,
an absorption strength is predetermined by means of a thickness of the first sub-region, and
the second peak wavelength of the secondary radiation is predetermined by means of the second bandgap.

6. The optoelectronic component according to claim 5, in which the maximum absorption wavelength is at most 50 nm greater than the first peak wavelength of the primary radiation.

7. The optoelectronic component according to claim 5, in which the first bandgap has a gradient.

8. The optoelectronic component according to claim 7, in which the first bandgap decreases towards the second bandgap.

9. The optoelectronic component according to claim 1, in which
the primary radiation has a spectral intensity that is greater than a spectral intensity of the secondary radiation.

10. The optoelectronic component according to claim 1, in which
the primary radiation and the secondary radiation intermix to form a mixed radiation.

11. The optoelectronic component according to claim 1, in which
the first semiconductor layer sequence comprises a first semiconductor region and a second semiconductor region,
the first active region is arranged between the first semiconductor region and the second semiconductor region,
the first semiconductor region is electrically conductively connected to a first contact structure, and
the second semiconductor region is electrically conductively connected to a second contact structure.

12. An illumination device with at least one optoelectronic component according to claim 1.

13. The illumination device according to claim 12, which is configured for illuminating plants.

14. A method for driving an optoelectronic component, the optoelectronic component comprising:
a semiconductor body comprising a first semiconductor layer sequence and
a second semiconductor layer sequence, which are arranged above one another in a stacking direction, wherein
the first semiconductor layer sequence has a first active region, which generates electromagnetic primary radiation with a first peak wavelength,
the second semiconductor layer sequence has a second active region, which has a section configured to partially absorb electromagnetic primary radiation and to re-emit electromagnetic secondary radiation having a second peak wavelength, and
the first peak wavelength is in a red wavelength range and the second peak wavelength is in an infrared wavelength range;
in which
the first active region is energized with at least one first current pulse or with at least one second current pulse, and
the first current pulse is applied to the first active region (3) with a first intensity (SI1) over a first time interval, or
the second current pulse is applied to the first active region with a second intensity over a second time interval, wherein
the first intensity is greater than the second intensity, and
the first time interval is shorter than the second time interval.

15. The method for driving an optoelectronic component according to claim 14, in which the first peak wavelength of the primary radiation generated by the first current pulse differs from the first peak wavelength of the primary radiation generated by the second current pulse by up to 1 nm.

16. An optoelectronic component comprising
a semiconductor body comprising a first semiconductor layer sequence and a second semiconductor layer sequence, which are arranged above one another in a stacking direction, wherein
the first semiconductor layer sequence has a first active region, which generates electromagnetic primary radiation with a first peak wavelength,
the second semiconductor layer sequence has a second active region, which has a section configured to partially absorb electromagnetic primary radiation and to re-emit electromagnetic secondary radiation having a second peak wavelength,
the section of the second active region comprises two sub-regions,
a first sub-region has a first bandgap, and
a second sub-region has a second bandgap, which is smaller than the first bandgap
a maximum absorption wavelength is predetermined by means of the first bandgap,
the maximum absorption wavelength is at most 50 nm greater than the first peak wavelength of the primary radiation,
a radiation exit surface of the semiconductor body comprises a top surface of the second semiconductor layer sequence facing away from the first semiconductor layer sequence,
the electromagnetic primary radiation and the electromagnetic secondary radiation are emitted from the radiation exit surface, and
the first peak wavelength is in a red wavelength range and the second peak wavelength is in an infrared wavelength range, or
the first peak wavelength is smaller than the second peak wavelength by at most 100 nanometers.

* * * * *